United States Patent
Tien

3,948,583
pr. 6, 1976

[54] ISOLATION OF PASSIVE DEVICES AND INTEGRATION WITH ACTIVE DEVICES IN OPTICAL WAVEGUIDING CIRCUITS

[75] Inventor: Ping King Tien, Chatham Township, N.J.

[73] Assignee: Bell Telephone Laboratories, Incorporated, Murray Hill, N.J.

[22] Filed: Dec. 9, 1974

[21] Appl. No.: 531,207

[52] U.S. Cl. .......................... 350/96 WG; 350/96 C
[51] Int. Cl.² ............................................. G02B 5/14
[58] Field of Search ...................... 350/96 WG, 96 C

[56] References Cited
UNITED STATES PATENTS

| 3,537,020 | 10/1970 | Anderson | 350/96 WG X |
|---|---|---|---|
| 3,610,727 | 10/1971 | Ulrich | 350/96 WG |
| 3,725,809 | 4/1973 | Ulrich et al. | 350/96 WG X |
| 3,760,297 | 9/1973 | Thompson | 350/96 WG X |
| 3,774,987 | 11/1973 | Boivin | 350/96 WG |
| 3,792,239 | 2/1974 | Ohlhaber et al. | 350/96 B X |

OTHER PUBLICATIONS

Boivin, "Thin–Film Laser–to–Fiber Coupler," *Applied Optics*, Vol. 13, No. 2, Feb. 1974, pp. 391–395.
Ostrowsky et al., "Integrated Optical Photodetector," *Applied Physics Letters*, Vol. 22, No. 9, May 1973, pp. 463–464.
"Optical Waveguide Shares Chip with Active Elements," *Electronics International*, Vol. 46, July 1973, pp. 56–57.
Reinhart et al., "Monolithically Integrated AlGaAs Double Heterostructure Optical Components," *Appl. Phys. Lett.*, Vol. 25, No. 10, Nov. 1974, pp. 622–624.

*Primary Examiner*—John K. Corbin
*Assistant Examiner*—Stewart Levy
*Attorney, Agent, or Firm*—Wilford L. Wisner

[57] ABSTRACT

The comprehensive large scale integration of thin-film optical circuits is made possible by a series of related developments. The key concept is the isolation of the high index substrate, necessary to active devices, wherever it is desired to have a passive device, by the interposition of an oxide layer such as $SiO_2$. It is preferred that the passive devices and the $SiO_2$ by amorphous. This new arrangement allows the use of discrete thin-film corner reflectors, instead of distributed feedback, in resonant active devices and wherever a reflector or beam-splitter is needed. Further, the active devices may be located photolithographically by etching windows in the $SiO_2$ layer. All of the active devices share a common active layer, which forms the passive devices wherever it extends between windows and simultaneously is the light guiding layer throughout.

9 Claims, 7 Drawing Figures

ISOLATION OF PASSIVE DEVICES AND INTEGRATION WITH ACTIVE DEVICES IN OPTICAL WAVEGUIDING CIRCUITS

BACKGROUND OF THE INVENTION

This invention relates to arrangements for the efficient large-scale integration of optical waveguiding circuits including thin-film type waveguiding circuits.

Rapid progress has been made in recent years in the field of integrated optics, including primarily thin-film integrated optical circuits but also the interfacing of such circuits with optical fiber waveguiding circuits and systems.

Nevertheless, the development of economical and effective integration of optical waveguiding circuits still faces many practical problems. Particularly, a thin-film laser intended for an integrated arrangement has been proposed to be made with a grating structure to be formed on the active layer. This grating structure forms the optical resonator and eliminates the need for conventional discrete mirrors that are incompatible with large scale integration of optical circuits.

Nevertheless, the grating-forming process introduces a high resistance region or surface which drastically degrades the efficiency of the laser.

The next problem is that it is typically desirable to form active optical devices on a semiconductor substrate, usually gallium arsenide or gallium aluminum arsenide, which has a relatively large refractive index. On the other hand, the passive part of the integrated optical circuit typically needs a relatively low refractive index, and, preferably, an amorphous substrate. That is, the substrate should exhibit neither demonstrable scattering effects associated with polycrystalline boundaries and dislocations nor the birefringence found in many single crystals, nor other spurious effects.

As a result of the foregoing difficulties, research attempts to form together the active and passive parts of the integrated optical circuit on a common substrate have not been notably successful. Evidently, new insights are needed to over-leap this combination of problems and achieve economical and effective large-scale integration of such optical waveguiding circuits.

SUMMARY OF THE INVENTION

According to my invention, all of the foregoing difficulties are resolved by a set of insights and related innovations.

According to the principal feature of my invention, the high-index substrate necessary to active devices is isolated from the waveguiding layer wherever it is desired to have a passive device by a much lower-index substrate, preferably an amorphous oxide substrate.

It is nonetheless, a subsidiary and related feature of my invention that the same waveguiding layer used in the passive devices at a subsequent point in the light propagation path can be a part of the active device, which in turn also includes portions of the substrate. That is, the active devices are formed through apertures in the insulating layer. In other words, all of the active devices include a common active layer that forms the passive devices between apertures and simultaneously is the waveguiding layer.

A further subsidiary of my invention is the provision of a novel junction laser having a resonator including two thin-film corner reflectors made as the passive devices in the waveguiding layer, and having one active region or portion within the waveguiding layer over such an aperture.

According to a different aspect of my invention, we have recognized that large scale integration of optical circuits is facilitated by the use of a set of windows etched through an insulating oxide layer, such as a silicon dioxide layer to expose a single-crystal substrate for active devices.

According to a still further feature of my invention, the essentially continuous nature of the waveguiding layer is differentiated into active and passive devices coupled together for guiding of the optical carrier wave not only by the location of the windows, but also by the disposition of discrete electrodes in proximity thereto to supply signal coupling with the active devices.

In my recent experiment, it is found interestingly that a layer of silver 2000 to 3000 A thick can be used instead of the $SiO_2$ layer described above. The silver layer according to my experiment, acts as a layer of dielectric with a refractive index about unity. Such a silver layer does isolate the substrate and thus serves the same function as the $SiO_2$ layer. In certain applications, the deposition of a silver layer is more convenient than that of $SiO_2$.

BRIEF DESCRIPTION OF THE DRAWINGS

Further features and advantages of my invention will become apparent from the following detailed description taken together with the drawings in which.

DESCRIPTION OF ILLUSTRATIVE EMBODIMENTS

Figure 3:
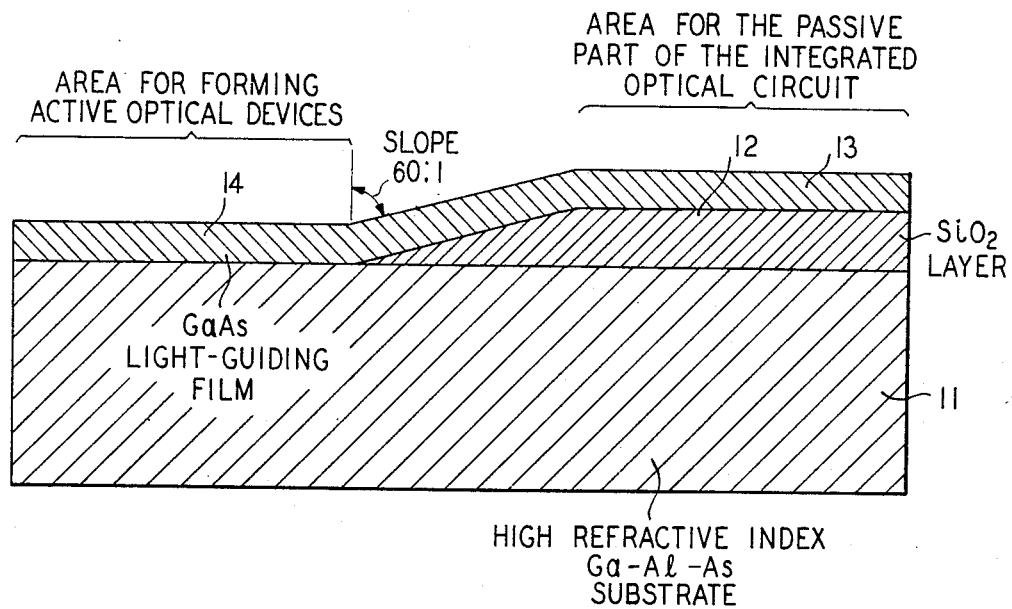
FIG. 3 is a cross-sectional view of the transition area from the passive device region to the active device region in such as integrated circuit.

The basic objective in this invention is, therefore, to develop new techniques for isolating the high-refractive-index substrate so that the passive circuit may be built together with the active devices. One method is shown in FIG. 3, in which a part of the substrate 11 is covered by a layer 12 of $SiO_2$ which has a refractive index, $n = 1.45$, considerably lower than that of the substrate 11, $n = 3.4$. The entire surface including the $SiO_2$ film is then covered by a layer 13 of GaAs light-guiding film which has a refractive index, $n = 3.5$, only slightly larger than that of the substrate. At the left, the GaAs film 14 is directly grown on the substrate. This part of the film is a single crystal; and it can be used as the active layer of the active devices such as lasers and modulators. At the right, the GaAs film 13 is grown on $SiO_2$ which isolates the high-index substrate and which, itself, may be considered as the substrate for this part of the light-guiding film. Moreover, this part of the GaAs film is amorphous and can be used to construct passive optical components. In order that the light wave can propagate freely in the light-guiding film from left to right, the SiO₂ layers must have a very gentle taper. A taper of the ratio 60:1 is usually required. Recently, we succeeded to deposit the SiO₂ film by reactive sputtering in oxygen atmosphere. In that process, the required tapered edge is formed naturally.

Now with the low-index SiO₂ isolating the high-index substrate, we can construct passive devices such as thin-film prisms, lenses, corner reflectors and polarizers on the SiO₂ layer. It is well known that these passive devices require a refractive index of the light-guiding layer to be substantially larger than that of the substrate.

Figure 1:
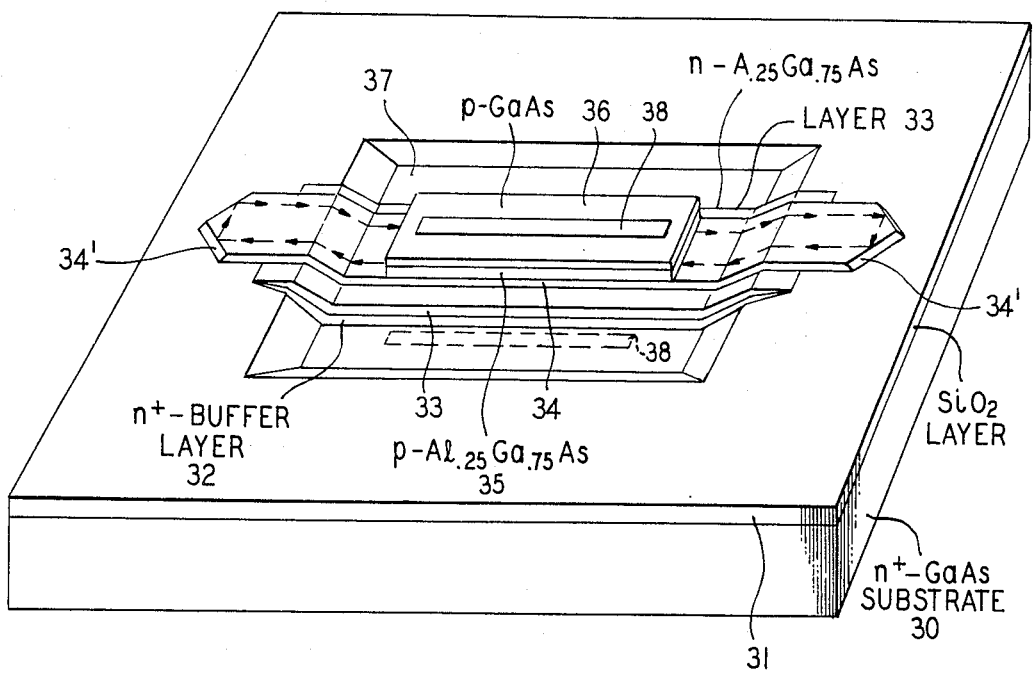
FIG. 1 is a pictorial perspective drawing of a functional laser according to my invention.

The most important active device in the integrated optical circuit is undoubtedly thin-film lasers, such as thin-film heterostructure junction laser shown in FIG. 1. This laser, in addition to the substrate, consists of five layers: $N^+$ buffer layer 32, the n-type $Al_{0.25}Ga_{0.75}As$ layer 33, the p-type gallium arsenide (GaAs) active layer 34, the p-type $Al_{0.25}Ga_{0.75}As$ layer 35 and the topmost p-type gallium arsenide layer 36. Among them the only layer which carries the light wave is the p-type gallium arsenide active layer 34, in which the thin-film corner reflectors are formed over the silicon dioxide insulating layer 31. In fact, in the vicinity of the corner reflector, the layer 34 is designated hereafter 34' to indicate that its thickness is tapered from that of the rest of layer 34 to induce the appropriate internal reflections.

To avoid the formation of high resistivity interfaces in the finished device of FIG. 1, all five of the layers of the laser 32 through 36 must be deposited on the previous layer continuously without any interruption. This fact is what rules out the use of distributed feedback techniques, since the formation of a grating structure would require interruption of the deposition process. Such requirements for interruption of the deposition process cause probably the most troublesome problems in the development of the field of integrated optics.

Thus, it is fortunate indeed that we find that the present technique avoids any need for interruption in the deposition process because, once a part of the substrate 30 is isolated by a silicon dioxide layer 31, it is possible to construct the thin-film corner reflectors 34' for forming an optical resonator for the laser of FIG. 1. The continuous nature of the deposition process makes the new structure relatively simple, efficient and economical.

In more detail, the process of making the device of FIG. 1 would comprise taking a substrate 30 of $n^+$ type gallium arsenide, forming a continuous layer 31 of the silicon dioxide, etching window 37 in layer 31, roughly 100 μm in size, and then continuing with the deposition of the layers described above. The edges of the window 37 are tapered typically with a very gentle slope of a ratio between them 60 to one. This window 37 permits single-crystalline laser layers e.g., 32 through 36, to grow directly on the gallium arsenide substrate 30, although some of the layers, particularly layer 34, could also be polycrystalline. It happens that the use of the substrate as a part of the active device itself, in addition to having the waveguiding layer 34 as a part of the active device, is of substantial benefit in enabling one to build a double heterostructure type junction laser in the integrated optical circuit. Typically, we grow a 2 μm $N^+$ type-buffer layer 32 and a 1.5 μm $n$-$Al_{0.25}Ga_{0.75}As$ layer 33 inside the window such that the edges of the layers overlap slightly those of the window. We then grow 0.4 μm p-GaAs active layer 34 which extends lengthwise well over the SiO₂ film so that it can form two rectangular corners at the two ends. These rectangular corners of the active layer are the corner reflectors 34' which reflect the laser beam as though they were the mirrors at the ends of the laser.

It is well known that in order to form a thin-film corner reflector, the refractive index of the light-guiding film must be more than 1.414 times that of the substrate. This condition is obviously satisfied with the SiO₂ layer isolating the GaAs substrate, indicating the importance of this invention.

Finally, we deposit a 2.5 μm p-$Al_{0.25}Ga_{0.75}As$ layer 35 and a 0.5 μm p-GaAs layer 36 on top of the active layer. However, they have the size of the window and thus leave the corner reflectors uncovered. To complete the laser construction, strip contacts 38 (not shown in full) are made to the top p-GaAs layer and the substrate. It should be apparent for this particular laser that the strip contacts will be positioned over layer 36 in the region directly over the window 37 and under the substrate 30 directly under the window.

It may be seen in FIG. 1 that the corner reflectors 34' of the active layer 34 form an optical cavity, in which a laser beam can be generated by the electron injection through the contacts 38 into the central part of layer 34. The laser beam inside the cavity forms a closed rectangular path; the active length of the laser is thus twice the length of the active layer and thus possesses twice as much gain. Moreover, our experiments show that the corner reflectors 34' reflect 100 percent of the incident light and they are the perfect mirrors for the laser.

Figure 2:
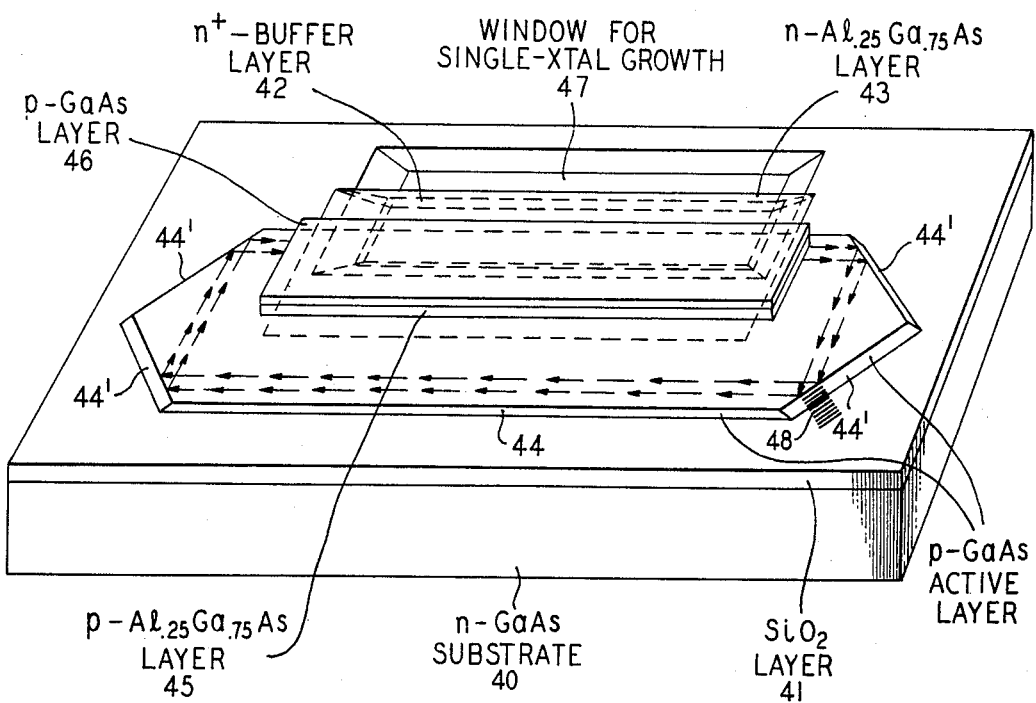
FIG. 2 is a modification of the embodiment of FIG. 1 providing a ring laser.

Another version of the laser is shown in FIG. 2. In this case, the bottom $n^+$ buffer layer 42 and $n$-$Al_{0.25}Ga_{0.75}As$ layers and the top p-$Al_{0.25}Ga_{0.75}As$ and p-GaAs layers occupy only a half width of the active layer so that a part of the optical cavity which contains the returned path of the laser beam is not covered. In FIG. 2, the corner reflectors 44' are disclosed so that one portion of the light path passes outside of the window region of window 47. As mentioned earlier, the bottom $N^+$ buffer layer 42 and the $n$-type $Al_{0.25}Ga_{0.75}As$ layer 45 and p-type layer of gallium arsenide 46 occupy only a half width of the active layer 44, so that the returned path of the laser beam is uncovered by the active regions of those top layers.

This design has the advantage that a beam splitter 48 may be formed inside the optical cavity so that a part of the laser beam can be diverted into another direction as a means of coupling the laser light out to the rest of the optical circuit. A beam splitter is simply a grating etched into the SiO₂ layer and it is done at the time when the window in the SiO₂ layer is being etched. All these are made before the fabrication of the laser and thus do not interfere with the continuity of the vacuum deposition processes.

Figure 4:
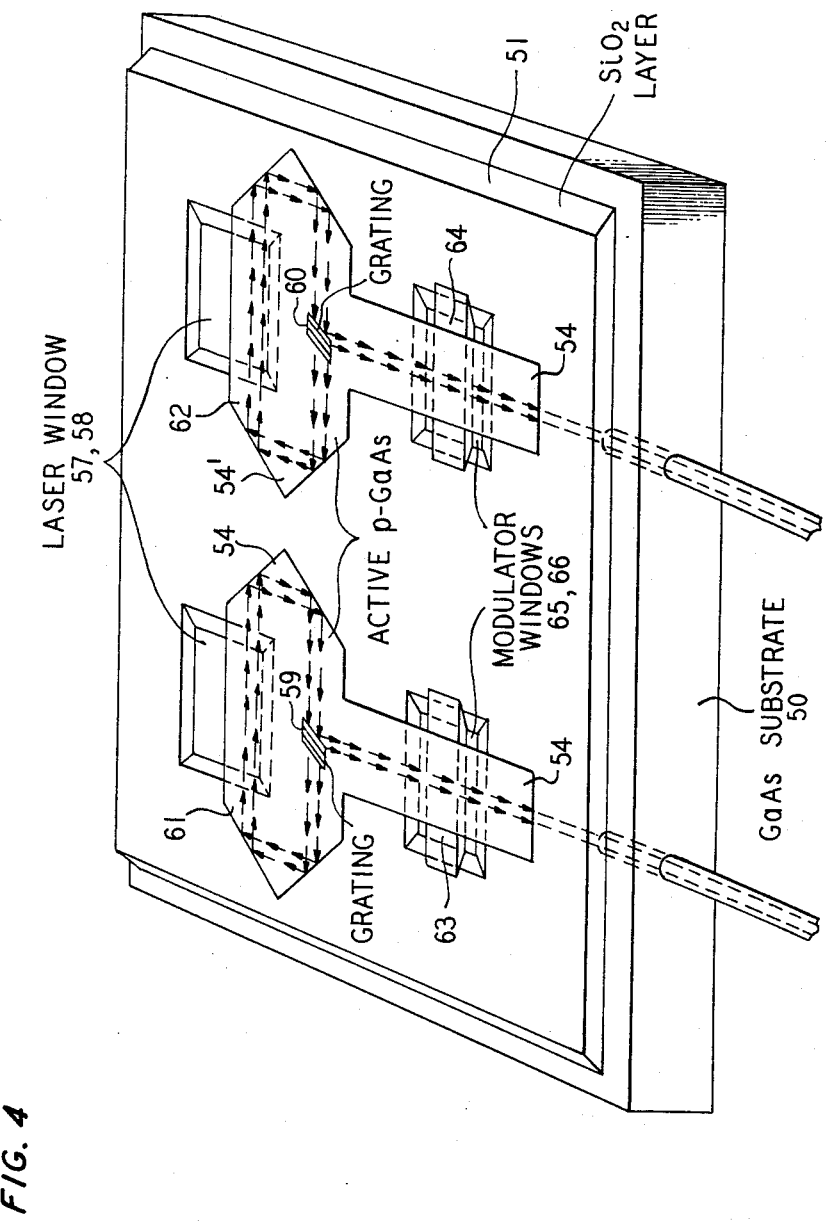
FIG. 4 is a pictorial perspective illustration of an integrated circuit chip including two ring lasers with their respective modulators and respective couplings to optical fiber links.

More importantly, the techniques described above create a new concept for the construction of integrated optical circuits. As shown in FIG. 4, a set of windows 57, 58, 65 and 66 can be etched into the SiO₂ layer 51. Inside the windows 57, 58, 65 and 66 active devices such as lasers 61 and 62, modulators 63 and 64, or alternatively switches 63 and 64 and scanners (not shown) which require single crystalline films are formed directly on the GaAs substrate 50. All these active devices share a common active layer 54 or 54' which extends over the windows to form the passive part of the optical circuit. Thus, the interconnection of different types of components by this technique is shown.

In fact, we have actually invented a technique which makes the large scale integration of the optical circuit possible. It is simple to use directly the active layer of the active devices as the light-guiding film for the entire optical circuit. For the fabrication of this type of the circuit, various mechanical masks are installed in the deposition chamber. They allow various devices to be formed simultaneously or sequentially. In our design of the fabrication, fine structures, such as gratings 59 and 60, prisms, lenses and polarizers, (not shown) are formed on the SiO$_2$ layer. The mechanical masks need only provide a pattern with a less stringent resolution as compared to that required in grating resonator reflectors, of tens of microns. This requirement is well within our capability of the present technology.

Figure 5:
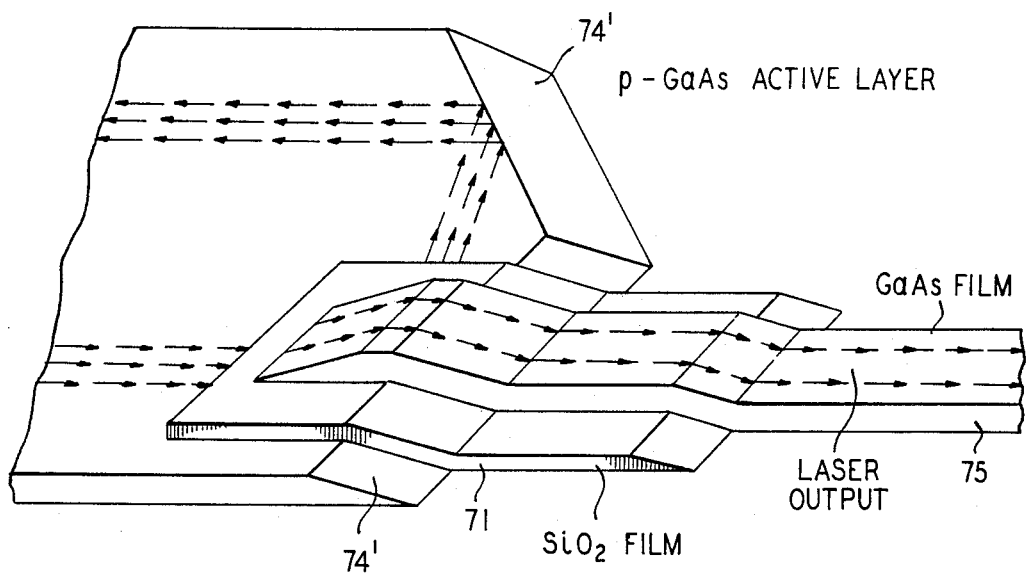
FIG. 5 shows a pictorial perspective diagram or an illustrative technique for coupling from such a ring laser to an output waveguiding film.

The laser light can also be coupled out of the cavity by the method shown in FIG. 5. In this figure, a layer 71 of 200–500 A thick SiO$_2$ is deposited directly over the laser path covering a part of the corner reflector 74'. Then another layer of GaAs 75 is formed over this new SiO$_2$ layer 71, serving as the output terminal of the laser or as the further waveguide path thereafter. The rest of the laser device to the left of the break point of the view of FIG. 6 can be like that in either of FIGS. 1 and 2. The degree of the output coupling obviously varies with the thickness of the SiO$_2$ layer 71, which can be designed according to the requirements.

With these new concepts and new techniques, the prospects of the integrated optics have never been brighter. We are discussing, for the first time, the large scale integration of the optical circuit. More importantly, lasers, modulators and passive devices made by the method described here are simple to construct and could also be more efficient.

Figure 6:
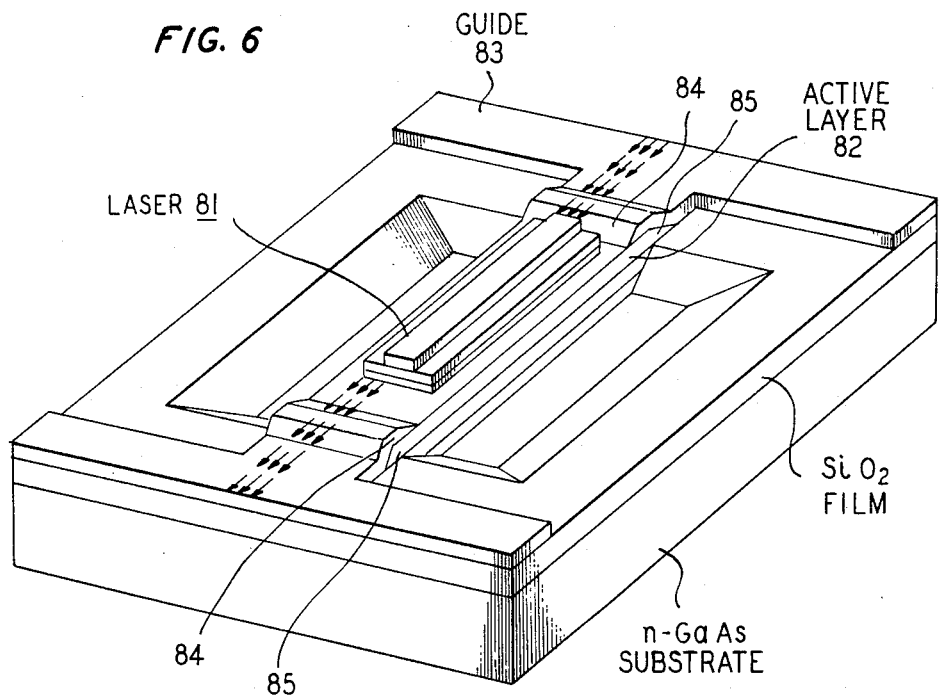
FIG. 6 shows a pictorial diagram of another embodiment of the invention.
Figure 7:
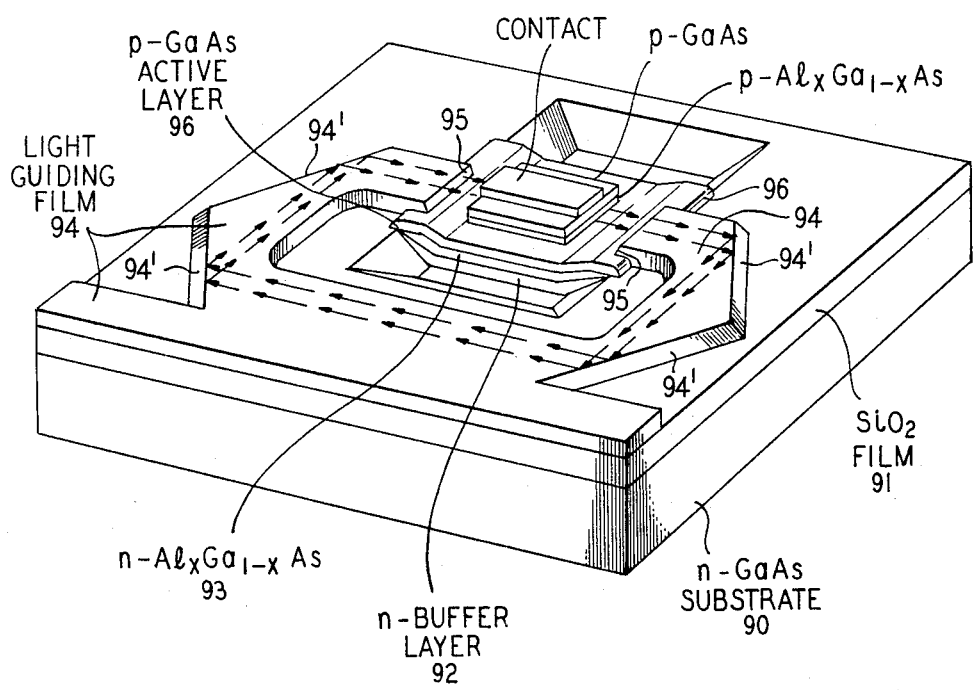
FIG. 7 is a pictorial diagram of a ring laser using the alternative techniques of FIG. 6.

FIGS. 6 and 7 show another version of the construction. In fabricating integrated optical circuits, there are times it is more convenient to fabricate first all the active devices, e.g., modulator 81, and then, all the passive devices, e.g., guide 83. In that case, the guiding-layer which forms the passive devices could join the active layer 82 of the active devices through overlapping tapered edges 84, 85. Specifically, FIG. 6 shows the active layer of a modulator 81 which is joined together with the light guiding film 83, which is one of the passive devices and connects to others (further passive devices not shown).

Similarly, FIG. 7 shows that the part of the optical cavity 94 which contains the corner reflectors 94' is an integrated part of other passive devices, e.g., the continuing guiding film 94 at bottom left of FIG. 7, and it joins the active layer of the laser through the overlapped tapered edges 95, 96.

What is claimed is:

1. An optical circuit comprising a substrate having a first index of refraction, an isolating layer disposed on said substrate and composed of material of much lower index of refraction than said first index, at least one passive optical device formed over said isolating layer, and at least one active optical device coupled with said passive optical device and formed at least in part in an aperture through said isolating layer, said active device including in a position under the aperture a substrate portion, the active and passive devices having the same potentially active waveguiding layer for a first frequency in common, said active optical device including means separate from said passive device for lower-frequency signal coupling with both the substrate portion and common layer portion of said active device.

2. An optical circuit according to claim 1 including output coupling means comprising a second isolating layer disposed over the waveguiding layer and a second waveguiding layer disposed over the second isolating layer, the first waveguiding layer being tapered in the region of a non-tapered portion of the second waveguiding layer and vice-versa with respect to orthogonal separation through said second isolating layer to provide a coupling between said waveguiding layers.

3. An optical circuit according to claim 1 in which the passive optical device comprises at least one corner reflector and the lower-frequency signal coupling means of the active device includes within coupling relationship to the substrate portion and the waveguiding layer at least two metallic signal coupling electrodes.

4. An optical circuit according to claim 3 in which the passive optical device includes a ring resonator having a light path from said corner reflector to a point of reentry to said active optical device.

5. An optical circuit according to claim 1 in which the active optical device and the passive optical device are separated by a transition region, said common waveguiding layer and said isolating layer in particular forming said transition region, said isolating layer being a layer of silver (Ag) tapered from substantially zero thickness to a full thickness between 2000 A and 3000 A.

6. An optical circuit according to claim 5 in which the silver layer is deposited to serve as a dielectric with an index of refraction of about unity.

7. An optical circuit according to claim 1 including at least one grating element formed in the isolating layer to facilitate coupling between active elements.

8. An optical circuit according to claim 7 in which a first active device comprises a ring laser, a second active device is included in the circuit and comprises a modulator, and the grating element is disposed in the isolating layer to provide coupling between said ring laser and said modulator.

9. An optical circuit according to claim 8 including a plurality of windows formed through the isolating layer, said active device being formed in part through said windows.

* * * * *